United States Patent [19]

Schwartzkopf

[11] Patent Number: 5,308,745

[45] Date of Patent: May 3, 1994

[54] ALKALINE-CONTAINING PHOTORESIST STRIPPING COMPOSITIONS PRODUCING REDUCED METAL CORROSION WITH CROSS-LINKED OR HARDENED RESIST RESINS

[75] Inventor: George Schwartzkopf, Franklin Township, Warren County, N.J.

[73] Assignee: J. T. Baker Inc., Phillipsburg, N.J.

[21] Appl. No.: 972,511

[22] Filed: Nov. 6, 1992

[51] Int. Cl.$^5$ .................................. G03C 5/00
[52] U.S. Cl. ........................... 430/329; 430/325; 430/326; 430/311; 430/256; 430/260
[58] Field of Search ............... 430/329, 325, 326, 311, 430/256, 260

[56] References Cited

U.S. PATENT DOCUMENTS

| | | | |
|---|---|---|---|
| 3,813,309 | 5/1974 | Bakos et al. | 156/2 |
| 4,395,479 | 7/1983 | Ward et al. | 430/258 |
| 4,401,747 | 8/1983 | Ward et al. | 430/258 |
| 4,401,748 | 8/1983 | Ward et al. | 430/258 |
| 4,403,029 | 9/1983 | Ward et al. | 430/258 |
| 4,428,871 | 1/1984 | Ward et al. | 252/542 |
| 4,592,787 | 6/1986 | Johnson | 134/38 |
| 4,617,251 | 10/1986 | Sizensky | 430/256 |
| 4,877,818 | 10/1989 | Emmons et al. | 430/313 |
| 5,102,777 | 4/1992 | Lin et al. | 430/329 |

FOREIGN PATENT DOCUMENTS

| | | | |
|---|---|---|---|
| 594509 | 3/1990 | Australia | G03F 7/02 |
| 485161 | 5/1992 | European Pat. Off. | G03F 7/42 |

OTHER PUBLICATIONS

Ambat, R. et al., Corrosion Science, vol. 33 No. 5, pp. 681–690 (1992).
Pai, P. et al., Proc. Interface, pp. 137–148 (1989).

*Primary Examiner*—John Kight, III
*Assistant Examiner*—Duc Truong
*Attorney, Agent, or Firm*—Parmelee, Bollinger & Bramblett

[57] ABSTRACT

Addition of non-nitrogen containing weak acids to amine-containing alkaline strippers for photoresists produce stripper compositions able to strip highly cross-linked or hardened photoresist films without producing any substantial metal corrosion. Weak acids useful in the stripping compositions include those having a pK in aqueous solution of 2.0 or higher and an equivalent weight of less than about 140 and are employed in an amount to neutralize from about 19% to about 75% of the amine present in the stripper composition.

20 Claims, No Drawings

ALKALINE-CONTAINING PHOTORESIST STRIPPING COMPOSITIONS PRODUCING REDUCED METAL CORROSION WITH CROSS-LINKED OR HARDENED RESIST RESINS

FIELD OF THE INVENTION

This invention relates to alkaline-containing photoresist stripping compositions that avoid or substantially eliminate metal corrosion on microcircuit substrates containing metals and coated with cross-linked or hardened photoresist resin. This invention also relates to a process for stripping photoresist from cross-linked or hardened substrates employing alkaline-containing photoresist stripping compositions without incurring any substantial metal corrosion in microcircuit substrates containing metal and which provide greatly improved strip rates, with consequent decrease in strip time, compared to stripping compositions not containing the alkaline component.

BACKGROUND OF THE INVENTION

An integral part of microelectronic fabrication is the use of photoresists to transfer an image from a mask or reticle to the desired circuit layer. After the desired image transfer has been achieved, the photoresist is removed by stripping before proceeding to some subsequent process step. Since about 1980, amides and mixtures of amides with various co-solvents have routinely been used for this stripping step, see for example U.S. Pat. Nos. 4,395,479; 4,428,871 and 4,401,748, issued to Ward et al.

Depending upon the type of pre-stripping processing that is performed while the photoresist is in place, the photoresist polymer may be cross-linked or hardened to the extent that amide-based solvents will no longer effectively strip the photoresist. Since about 1985, the use of amide mixtures containing additional alkaline components, such as organic amines (U.S. Pat. Nos. 4,592,787 Johnson; 4,765,844 Merrem; 4,617,251 Sizensky; WO 87/05314 Turner; U.S. Pat. No. 4,791,043 Thomas et al.) or quaternary ammonium hydroxides (U.S. Pat. No. 4,776,892 Steppan et al; 4,744,834 Haq; WO 88/05813 Martin) were introduced to facilitate the removal of such hardened photoresists.

The use of these alkaline strippers on microcircuit substrates containing metal films, particularly aluminum or various combinations or alloys of active metals such as aluminum or titanium with more electropositive metals such as copper or tungsten, has proven problematic. Various types of metal corrosion, such as corrosion whiskers, pitting, notching of metal lines, have been observed due, at least in part, to reaction of the metals with alkaline strippers. Further it has been shown, by Lee et al., Proc. Interface '89, pp. 137–148, that very little corrosive action takes place until the water rinsing step that is required to remove the organic stripper from the wafer. The corrosion is evidently a result of contacting the metals with the strongly alkaline aqueous solution that is present during rinsing. Aluminum metal is known to corrode rapidly under such conditions—Ambat et al., Corrosion Science, Vol. 33 (5), p. 684, 1992.

In the past it has been proposed to circumvent this problem by employing intermediate rinses with non-alkaline organic solvents such as isopropyl alcohol. It would be desirable to avoid the expense and possible safety, chemical hygiene, and environmental consequences of such an intermediate rinse by eliminating this additional rinse by providing an effective stripper that does not require it.

In U.S. Pat. No. 5,102,777, issued on Apr. 27, 1992 to Lin et al., it is proposed to combat such corrosion by employing a positive photoresist stripper composition which includes a solvent system having solubility parameters which fall within a range of from about 8.5 to about 15 in an amount which falls within a range of about 65% to about 98%. In addition, an amine is present in an amount of from about 2% to about 25% and also a fatty acid having 8 to 20, preferably 10 to 16, carbon atoms in an amount of from about 0.1% to about 10% such that the amount of amine and fatty acid is selected to provide a pH of from about 6 to 9.5, preferably 7 to 8.5. However, while the positive photoresist stripping compositions disclosed in said patent were found to provide some beneficial effect vis-a-vis metal corrosion, these disclosed stripping compositions were not able to be used to satisfactorily strip hard-to-strip cross-linked or hardened photoresist resins. Moreover, in the one stripping formulation of the patent which is capable of stripping cross-linked photoresist resins, one is not able to prevent or avoid metal corrosion. These deficiencies and drawbacks of the stripping compositions of the Lin et al. patent are demonstrated in the Comparative Example set forth hereinafter in this specification.

It is therefore an object of this invention to provide alkaline-containing photoresist strippers which do not require intermediate rinses to avoid metal corrosion and yet the photoresist strippers are still highly effective in stripping cross-linked or hardened photoresists. A further object of this invention is to provide such improved non metal corroding, alkaline-containing photoresist compositions without any undue adverse effect on strip rate of the photoresist for cross-linked or hardened photoresists.

BRIEF SUMMARY OF THE INVENTION

It has now been discovered that the addition of certain non-nitrogen containing weak acids to alkaline strippers results in stripper compositions that yield considerably less alkaline solution during rinsing with pure water but nevertheless retain their ability to strip highly cross-linked or hardened photoresist films without producing any substantial undesirable metal corrosion. This is especially surprising since more than half of the alkaline component can be neutralized with the weak acid without significantly adversely altering the stripping times or rates. It has also been discovered that these lower pH aqueous solutions cause considerably less corrosion on metal than the water rinse solutions resulting from alkaline-containing strippers that are not modified via the weak acid addition of this invention. A further discovery resides in the discovery that the photoresist strippers of this invention are able to satisfactorily strip hardened or cross-linked photoresist resins while producing substantially no undesirable metal corrosion.

DETAILED DESCRIPTION OF THE INVENTION

The non-nitrogen containing weak acids that may be employed in this invention include organics such as carboxylic acids or phenols as well as salts of inorganic acids such as carbonic or hydrofluoric acid.

By weak acids is meant acids having a strength expressed as a "pK" for the dissociation constant in aqueous solution of at least 2.0 or higher, preferably 2.5 or higher. Particularly useful are weak acids of pK>2.0 and preferably having an equivalent weight of less than about 140. As examples of such non-nitrogen containing weak acids useful in this invention there may be mentioned, for example, carboxylic acids such as acetic acid, phthalic acid, phenoxyacetic acid and the like, organic acids such as 2-mercaptobenzoic acid, 2-mercaptoethanol and the like, phenols generally having pK in the range of from 9 to 10, such as phenol, 1,3,5-trihydroxybenzene, pyrogallol, resorcinol, 4-tert-butylcatechol and the like, and inorganic acids such as carbonic acid, hydrofluoric acid and the like. The amount of weak acid employed in the stripping compositions of this invention is from about 0.05% to about 25% by weight of said composition and is present in an amount to neutralize about 19% to about 75% by weight of the amine present in the stripper composition thereby resulting in an aqueous rinse pH for said stripper compositions of from about pH 9.6 to about 10.9.

Alkaline stripper components that may be used in this invention also cover a wide range of structural types. Their dissociation constants, once again expressed as pK values, range from about 9 to 11 for the beta-oxygen or -nitrogen substituted amines to 8.3 for the secondary amine, morpholine and hydroxylamines and hydroxylamine derivatives of somewhat lower pK values. Among the alkaline components that may be used there may be mentioned, nucleophilic amines, preferably for example, 1-amino-2-propanol, 2-(2-aminoethoxy)ethanol, 2-aminoethanol, 2-(2-aminoethylamino)ethanol, 2-(2-aminoethylamino)ethylamine and the like. More important than the actual pK value of an amine is its nucleophilicity which should be high. The amount of amine component employed in the stripping compositions of this invention is from about 1% to about 50% by weight of said composition.

It is believed that the interaction of these alkaline stripper components with the range of weak acids used in this invention is essentially reversible:

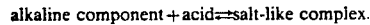
alkaline component + acid ⇌ salt-like complex.

Because of the reversibility of this reaction, substantial concentrations of the alkaline component would remain available during the stripping process even though much of the alkaline component has been neutralized from a stoichiometric point of view. This would account for the surprisingly rapid stripping rates that are observed even in the presence of these acids.

The photoresist stripping compositions of this invention which contain the aforementioned alkaline component and weak acid component will also comprise an organic solvent system. The organic solvent system is one having a solubility parameter of from about 8 to about 15, obtained by taking the square root of the sum of the squares of the three Hansen solubility parameters (dispersive, polar and hydrogen bonding). The solvent system may comprise any of a number of individual solvents or a mixture of several different solvents. As example of such solvents there may be mentioned, various pyrrolidinone compounds such as 2-pyrrolidinone, 1-methyl-2-pyrrolidinone, 1-ethyl-2-pyrrolidinone, 1-propyl-2-pyrrolidinone, 1-hydroxyethyl-2-pyrrolidinone, 1-hydroxypropyl-2-pyrrolidinone, and the like, diethylene glycol monoalkyl ethers such as those of the formula HOCH$_2$CH$_2$—O—CH$_2$CH$_2$—O—R where R is an alkyl radical of from 1 to 4 carbon atoms, compounds containing sulfur oxides such as dialkyl sulfones of the formula

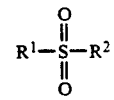

where R$^1$ and R$^2$ are alkyl of 1 to 4 carbon atoms, dimethyl sulfoxide (DMSO), tetrahydrothiophene-1,1-dioxide compounds of the formula

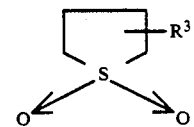

wherein R$^3$ is hydrogen, methyl or ethyl, such as sulfolane, methyl sulfolane and ethyl sulfolane, as well as polyethylene glycols, dimethylacetamide or dimethylformamide. The solvent system portion of the stripper compositions of this invention will generally comprise from about 50% to about 98% by weight of the composition, preferably about 85% to about 98% by weight.

The stripping compositions of this invention are effective in stripping a wide and varied range of photoresists especially positive photoresists. Most photoresists consist of an ortho naphthoquinone diazide sulfonic acid ester or amide sensitizer or photoactive component, with novolak, resole, polyacrylamide or acrylic copolymer type binders or resins. Such photoresists are well known in the art. Such resists and sensitizers are described for example, in U.S. Pat. Nos. 3,046,118; 3,046,121; 3,106,465; 3,201,239; 3,538,137; 3,666,473; 3,934,057; 3,984,582 and 4,007,047. As examples of photoresist compositions for which the stripping composition of this invention may be used there may be mentioned KTI Chemicals photoresist KTI 820, KTI 825, KTI 875 and KTI 895i; J. T. Baker Inc. photoresist 1-PR-21 and E38; Olin Hunt WX-309, HiPR 6500 series photoresists and OiR 3712 photoresist; Hoechst Celanese photoresists 5214-E, AZ-5200 and AZ-6212; Shipley Company photoresists MF-314, XP-8843, Megaposit SPR 500 and Megaposit SNR 248; Fuji Hunt Electronics photoresists FH 6450 and FX-EX1; Tokyo Ohka Kogyo Co. Ltd. photoresist THMR-iP800; MacDermid photoresist PR-1024 MB; Dynachem Division of Morton International photoresists Nova 2000 series, e.g. Nova 2020 and Nova 2070; Japan Synthetic Rubber photoresist PFR 1X500EL; Sumitomo Chemical photoresist Sumiresist PFI-15; and Toray Industries photoresist PR-a1200, and the like.

EXAMPLE 1

Silicon wafers were primed with hexamethyldisilazane and spun with about 1000 nm of J. T. Baker Inc. 1-PR-21 photoresist. The wafers were then soft-baked for 30 min. at 95° C., then hard-baked for 60 min. at 200° C. giving a highly cross-linked resist film. The wafers were then stripped at 95° C. in the solutions listed below and the time at which the photoresist layer was fully stripped was recorded. These are shown below (plus or minus one standard deviation of the several replicate wafers that were used). The alkaline stripper used in this example comprises 90% of N-methylpyrrolidinone (NMP) and 10% of 1-amino-2-propanol. The acid used was acetic acid. Water rinse pH was determined at 19:1 dilution of these mixtures with deionized water and is also listed. The aluminum (foil coupons=1.5×1.5×.004 inches) corrosion weight loss shown was determined at 9:1 dilution with deionized water at room temperature for 24 hours.

| Formulation | Gm. acid/ kg · formulation | Strip Time (sec) | % Amine neutralized | Water rinse pH | Corrosion weight loss (%) |
|---|---|---|---|---|---|
| NMP only | 0 | 390 ± 50 | | | |
| Alkaline stripper | 0 | 107 ± 5 | 0 | 11.6 | 13 |
| Alkaline stripper | 10 | 96 ± 2 | 12.5 | 10.8 | 5 |
| Alkaline stripper | 20 | 104 ± 9 | 25 | 10.4 | 2 |
| Alkaline stripper | 30 | 98 ± 3 | 37.5 | 10.2 | 1 |
| Alkaline stripper | 40 | 98 ± 7 | 50 | 9.9 | 0.9 |
| Alkaline stripper | 50 | 103 ± 4 | 62.5 | 9.7 | 0.4 |

EXAMPLE 2

This example was conducted according to the procedure of Example 1 except that the alkaline stripper comprised 90% of dimethylformamide (DMF) and 10% of 2-(2-aminoethoxy)ethanol, the acid was phenol, and the stripping temperature was 85° C.

| Formulation | Gm. acid/ kg · formulation | Strip Time (sec) | % Amine neutralized | Water rinse pH | Corrosion weight loss (%) |
|---|---|---|---|---|---|
| DMF only | 0 | 426 ± 44 | | | |
| Alkaline stripper | 0 | 47 ± 2 | 0 | 11.2 | 9.4 |
| Alkaline stripper | 10 | 48 ± 2 | 11 | 10.8 | 4.8 |
| Alkaline stripper | 20 | 52 ± 1 | 22 | 10.6 | 3.4 |
| Alkaline stripper | 30 | 54 ± 1 | 33 | 10.5 | 3.8 |
| Alkaline stripper | 40 | 55 ± 1 | 44 | 10.4 | 2.1 |
| Alkaline stripper | 50 | 55 ± 2 | 55 | 10.3 | 2.4 |

EXAMPLE 3

This example was conducted according to the procedure of Example 1 except that the alkaline stripper comprised 90% of dimethylacetamide (DMAc) and 10% of 2-aminoethanol, the acid was 1,3,5-trihydroxybenzene, and the stripping temperature was 85° C.

| Formulation | Gm. acid/ kg · formulation | Strip Time (sec) | % Amine neutralized | Water rinse pH | Corrosion weight loss (%) |
|---|---|---|---|---|---|
| DMAc only | 0 | 343 ± 34 | | | |
| Alkaline stripper | 0 | 51 ± 7 | 0 | 11.7 | 16 |
| Alkaline stripper | 11 | 56 ± 2 | 12.5 | 11.0 | 11 |
| Alkaline stripper | 22 | 55 ± 5 | 25 | 10.7 | 9 |
| Alkaline stripper | 33 | 53 ± 3 | 37.5 | 10.6 | 5 |
| Alkaline stripper | 44 | 53 ± 3 | 50 | 10.4 | 4 |
| Alkaline stripper | 55 | 61 ± 2 | 62.5 | 10.3 | 2 |

EXAMPLE 4

This example was conducted according to the procedure of Example 1 (alkaline stripper=90% NMP and 10% 1-amino-2-propanol) except that the acid component was varied through a series of weak acids of various structural types. Stripping temperature was 85° C.

| Formulation | Gm. acid/ kg · formulation | Strip Time (sec) | % Amine neutralized | Water rinse pH | Corrosion weight loss (%) |
|---|---|---|---|---|---|
| NMP only | 0 | 648 | | | |
| Alkaline stripper (AS) | 0 | 219 ± 31 | 0 | 11.6 | 13 |
| AS + pyrogallol | 50 | 231 ± 15 | 69 | 10.3 | 5 |
| AS + resorcinol | 50 | 251 ± 19 | 68 | 10.4 | 4 |
| AS + 4-tert-butylcatechol | 70 | 245 ± 29 | 63 | 10.5 | 0 |
| AS + phthalic acid | 70 | 238 ± 36 | 63 | 9.7 | 0.7 |
| AS + phenoxyacetic acid | 100 | 257 ± 22 | 49 | 9.9 | 1 |

EXAMPLE 5

This example was conducted according to the procedure of Example 1 except that two different alkaline stripper systems were used: AS 1=90% dimethylacetamide (DMAc)+10% 2-(2-aminoethylamino)ethanol with or without added acetic acid; AS 2=90% dimethylacetamide (DMAc)+6% 2-(2-aminoethylamino)ethylamine with or without added phenol. Stripping temperature was 85° C.

| Formulation | Gm. acid/ kg · formulation | Strip Time (sec) | % Amine neutralized | Water rinse pH | Corrosion weight loss (%) |
|---|---|---|---|---|---|
| DMAc only | 0 | 471 ± 38 | | | |
| AS 1 | 0 | 97 ± 2 | 0 | 11.4 | 8 |
| AS 1 + acetic acid | 4 | 149 ± 10 | 69 | 9.6 | 0.4 |
| AS 2 | 0 | 242 ± 48 | 0 | 11.4 | 8 |
| AS 2 + phenol | 6 | 226 ± 26 | 53 | 10.3 | 3 |

EXAMPLE 6

This example was conducted according to the procedure of Example 1 except that the alkaline stripper comprised 90% of 2-pyrrolidinone and 10% 1-amino-2- propanol, the acid was acetic acid, and the stripping temperature was 100° C.

| Formulation | Gm. acid/ kg · formulation | Strip Time (sec) | % Amine neutralized | Water rinse pH | Corrosion weight loss (%) |
|---|---|---|---|---|---|
| 2-pyrrolidinone only | 0 | 491 ± 14 | | | |
| Alkaline stripper | 0 | 201 ± 9 | 0 | 11.5 | 14 |
| Alkaline stripper | 50 | 221 ± 24 | 62.5 | 9.6 | 0 |

EXAMPLE 7

This example was conducted according to the procedure of Example 1 except that three different alkaline stripper systems were used and the pH controlling materials were weak inorganic acids: AS 1=90% NMP+10% 1-amino-2-propanol with or without added carbonic acid (generated via ammonium carbonate addition); AS 2=90% NMP+10% 2-(2-aminoethoxy)ethanol with or without added 47% aq. hydrofluoric acid; AS 3=90% NMP+10% 2-aminoethanol with or without added 47% aq. hydrofluoric acid. Stripping temperature was 85° C.

| Formulation | Gm. acid/ kg · formulation | Strip Time (sec) | % Amine neutralized | Water rinse pH | Corrosion weight loss (%) |
|---|---|---|---|---|---|
| NMP only | 0 | 337 ± 36 | | | |
| AS 1 | 0 | 135 ± 12 | 0 | 11.4 | 10 |
| AS 1 + carbonic acid | 26 | 126 ± 16 | 62 | 10.0 | 2 |
| AS 2 | 0 | 132 ± 12 | 0 | 11.3 | 9 |
| AS 2 + HF | 9 | 110 ± 4 | 49 | 9.8 | 2 |
| AS 3 | 0 | 67 ± 3 | 0 | 11.5 | 17 |
| AS 3 + HF | 16 | 70 ± 9 | 50 | 10.4 | 3 |

EXAMPLE 8

In a manner similar to Example 4, the acid component was varied through a series of sulfur-containing acid types. In this example the alkaline stripper was 90% of N-methylpyrrolidinone (NMP) and 10% of 2-aminoethanol and the photoresist used was commercially available, KTI 895i photoresist. Processing was similar to the previously used Baker 1-PR-21 including cross-linking at 200° C. for 60 minutes. A stripping temperature of 95° C. was utilized:

| Formulation | Gm. acid/ kg · formulation | Strip Time (sec) | % Amine neutralized | Water rinse pH | Corrosion weight loss (%) |
|---|---|---|---|---|---|
| NMP only | 0 | 359 ± 30 | | | |
| Alkaline stripper (AS) | 0 | 48 ± 6 | 0 | 11.6 | 14 |
| AS + 2-mercaptobenzoic acid | 60 | 86 ± 3 | 48 | 10.2 | 0.5 |
| AS + 62-mercaptoethanol | 60 | 49 ± 3 | 47 | 10.4 | 2 |

| Formulation | Gm. acid/ kg · formulation | Strip Time (sec) | % Amine neutralized | Water rinse pH | Corrosion weight loss (%) |
|---|---|---|---|---|---|
| toethanol | | | | | |

EXAMPLE 9

This example was conducted in a manner similar to Example 1. The alkaline stripper was 90% N-methylpyrrolidinone (NMP) and 10% 1-amino-2-propanol plus 50 gm. acetic acid/kg. formulation. The effect of adding 10% by weight of various common stripper co-solvents was measured. Stripping temperature was 85° C.

| Formulation | Identity of 10% co-solvent | Strip Time (sec) | % Amine neutralized | Water rinse pH | Corrosion weight loss (%) |
|---|---|---|---|---|---|
| NMP only | none | 475 ± 38 | | | |
| Alkaline stripper (AS) | none | 219 ± 21 | 62.5 | 9.7 | 0.7 |
| AS + | sulfolane | 290 ± 4 | 62.5 | 9.7 | 1 |
| AS + | N-(2-hydroxyethyl)pyrrolidinone | 254 ± 11 | 62.5 | 9.7 | 0.9 |
| AS + | N-cyclohexylpyrrolidinone | 297 ± 17 | 62.5 | 9.7 | 0.4 |
| AS + | triethyleneglycol methyl ether | 266 ± 9 | 62.5 | 9.6 | 0.9 |
| AS + | diethyleneglycol ethyl ether | 283 ± 2 | 62.5 | 9.6 | 1 |

This example shows that co-solvents may be added to these partially neutralized compositions with retention of the desired pH and corrosion properties and only a slight loss of stripping speed.

EXAMPLE 10

This example was conducted in a manner similar to Example 1 except that the alkaline stripper employed 90% dimethyl sulfoxide (DMSO) solvent and 10% of 1-amino-2-propanol. The acid employed was acetic acid. Stripping temperature was 80° C.

| Formulation | Gm. acid/ kg · formulation | Strip Time (sec) | % Amine neutralized | Water rinse pH | Corrosion weight loss (%) |
|---|---|---|---|---|---|
| DMSO only | 0 | 356 ± 27 | | | |
| Alkaline stripper | 0 | 45 ± 5 | 0 | 11.6 | 11 |
| Alkaline stripper | 10 | 53 ± 9 | 12.5 | 10.7 | 4 |
| Alkaline stripper | 20 | 60 ± 9 | 25 | 10.4 | 2 |
| Alkaline stripper | 30 | 84 ± 8 | 37.5 | 10.1 | 0.7 |
| Alkaline stripper | 40 | 70 ± 10 | 50 | 9.9 | 0.4 |
| Alkaline | 50 | 93 ± 29 | 62.5 | 9.7 | 0.3 |

| Formulation | Gm. acid/ kg · formulation | Strip Time (sec) | % Amine neutralized | Water rinse pH | Corrosion weight loss (%) |
|---|---|---|---|---|---|
| stripper | | | | | |

COMPARATIVE EXAMPLE

This is a comparative example of the six stripper compositions exemplified in column 5 of U.S. Pat. No. 5,102,777. The table in U.S. Pat. No. 5,102,777 does not specify the processing conditions or the photoresist used. In this comparative example the cross-linked photoresist resin KTI 895i was used and baked at 200° C. for 60 minutes and stripped at a stripping temperature of 85°-90° C., which approximates the degree of photoresist removal difficulty that is commonly encountered in current integrated circuit fabrication and is typical of the conditions used in the examples of this invention. An example of a stripping composition with only N-methylpyrrolidinone is included as a basis for comparison.

| Solvent | Acid | Amine | Strip Time (sec) | % Amine neutralized | Water rinse pH | Corrosion weight loss (%) |
|---|---|---|---|---|---|---|
| 100% NMP | none | none | >900b | | | |
| 95% NMP | .5% capric | 4.5% TEA | >900a | 10 | 9.1 | 0.7 |
| 95% DE | .5% capric | 4.5% TEA | >1800b | 10 | 8.8 | |
| 50% NMP/ 46.5% DE | .5% capric | 3% TEA | >1800b | 14 | 8.7 | |
| 50% NMP/ 46.5% BLO | .5% lauric | 3% DGA | >1800b | * | water insoluble | |
| 50% NMP/ 46.5% DE | .5% lauric | 3% DEA | >1800b | 9 | 10.0 | |
| 70% NMP/ 25% DMAc | .5% lauric | 4.5% MPA | 92a | 4 | 11.5 | 16 |
| 69.8% NMP/ 25% DMAc | .7% acetic | 4.5% MPA | 127a | 19 | 11.1 | 7 |
| 94.8% NMP | .7% acetic | 4.5% MIPA | 188a | 19 | 10.6 | 3 |
| 87.4% NMP | 2.9% acetic | 9.7% MIPA | 185b | 38 | 10.2 | 1 |

NMP = N-methylpyrrolidinone
DE = diethyleneglycol monobutyl ether
BLO = gamma-butyrolactone
DMAc = dimethylacetamide
TEA = triethanolamine
DGA = diglycolamine ([2-aminoethoxy]-ethanol)
DEA = diethanolamine
MPA = monopropanolamine (3-aminopropanol)
MIPA = monoisopropanolamine (1-amino-2-propanol)
* BLO = reacts with DGA at room temperature forming an amide, thus no amine is present to neutralize
a = strip temperature of 85° C.
b = strip temperature of 90° C.

Evidently rather mild processing conditions are in use for the examples in U.S. Pat. No. 5,102,777 (center section of the foregoing data) since the first five of said stripping compositions do not strip cross-linked photoresists and are essentially equivalent to unmodified NMP in stripping ability. The only stripping composition example of U.S. Pat. No. 5,102,777 capable of removing this KTI 895i resist (the sixth entry in the center section of the foregoing data) also caused considerable aluminum corrosion (16% weight loss). This is due to insufficient neutralization (4%) of the amine present resulting in a pH of 11.5.

The last three stripper examples of the foregoing table are within the scope of the present invention, which demonstrates the ability of the stripping compositions of this invention to strip cross-linked photoresists with reduced levels of aluminum corrosion.

In each of the foregoing examples of stripping compositions according to this invention, addition of the alkaline material to the solvent decreases the strip time (increases the strip rate) markedly demonstrating that alkaline strippers are effective for highly cross-linked photoresists. However, neutralization of a substantial portion of these alkaline materials, over the broad range of solvent, base, and acid types utilized in Examples 1-10, unexpectedly gives new formulations that retain this property of stripping cross-linked resists. At the same time these formulations yield rinse water of considerably lower pH. The lower rinse pH resulting from these modified photoresist stripper formulations gives dramatically less aluminum metal corrosion. Other metals and metal combinations that are subject to alkaline corrosion would be expected to show similar improved behavior.

With the foregoing description of the invention, those skilled in the art will appreciate that modifications may be made to the invention without departing from the spirit thereof. Therefore, it is not intended that the scope of the invention be limited to the specific embodiments illustrated and described.

I claim:

1. An alkaline-containing photoresist stripping composition comprising a stripping solvent, a nucleophilic amine and a non-nitrogen containing weak acid in an amount sufficient to neutralize from about 19% to about 75% by weight of the nucleophilic amine such that the stripping composition has an aqueous pH of within the range of from bout 9.6 to about 10.9, said weak acid having a pK value in aqueous solution of 2.0 or greater and an equivalent weight of less than 140, whereby said stripping composition is able to strip hardened or highly cross-linked photoresist resin film from a substrate containing metal without producing any substantial metal corrosion.

2. An alkaline-containing photoresist stripping composition according to claim 1 wherein:
the stripping solvent is a stripping solvent system having a solubility parameter of from about 8 to about 15 and is present in an amount of from about 50% to about 98% by weight of the stripping composition; and the nucleophilic amine is present in an amount of from about 1 to about 50% by weight of the stripping composition.

3. An alkaline-containing stripping composition according to claim 2 wherein the weak acid is present in the stripping composition in an amount of from about 0.05% to about 25% by weight of said stripping composition.

4. An alkaline-containing photoresist stripper according to claim 3 wherein the weak acid has a pK of 2.5 or higher.

5. An alkaline-containing photoresist stripper according to claim 2 wherein the weak acid is selected from the group consisting of acetic acid, phthalic acid, 2-mercaptobenzoic acid, 2-mercaptoethanol, 1,3,5-trihydroxybenzene, pyrogallol, resorcinol, 4-tert-butylcatechol, carbonic acid and hydrofluoric acid.

6. An alkaline-containing photoresist stripper according to claim 3 wherein the weak acid is selected from the group consisting of acetic acid, phthalic acid, 2-mercaptobenzoic acid, 2-mercaptoethanol, 1,3,5-trihydroxybenzene, pyrogallol, resorcinol, 4-tert-butylcatechol, carbonic acid and hydrofluoric acid.

7. An alkaline-containing photoresist stripping composition according to claim 6 wherein the weak acid is acetic acid.

8. An alkaline-containing photoresist stripping composition according to claim 6 wherein the amine is selected from the group consisting of 1-amino-2-propanol, 2-(2-aminoethoxy)ethanol, 2-aminoethanol, 2-(2-aminoethylamino)-ethanol and 2-(2-aminoethylamino)ethylamine.

9. An alkaline-containing photoresist stripping composition according to claim 7 wherein the amine is selected from the group consisting of 1-amino-2-propanol, 2-(2-aminoethoxy)ethanol, 2-aminoethanol, 2-(2-aminoethylamino)-ethanol and 2-(2-aminoethylamino)ethylamine.

10. An alkaline-containing photoresist stripping composition comprising on a weight basis:
from about 50% to about 98% of a stripping solvent having a solubility parameter of from about 8 to about 15,
from about 1% to about 50% by weight of a nucleophilic amine, and
from about 0.05% to about 25% by weight of a non-nitrogen containing weak acid having a pK value in aqueous solution of 2.0 or greater, an equivalent weight of less than 140 and present in the stripping composition in an amount to neutralize from about 19% to about 75% by weight of the nucleophilic amine such that the stripping composition has an aqueous rinse pH of within the range of from about pH 9.6 to about 10.9.

11. An alkaline-containing photoresist stripper according to claim 10 wherein the weak acid is selected from the group consisting of acetic acid, phthalic acid, 2-mercaptobenzoic acid, 2-mercaptoethanol, 1,3,5-trihydroxybenzene, pyrogallol, resorcinol, 4-tert-butylcatechol, carbonic acid and hydrofluoric acid.

12. An alkaline-containing photoresist stripping composition according to claim 10 wherein the weak acid is acetic acid.

13. An alkaline-containing photoresist stripping composition according to claim 11 wherein the amine is selected from the group consisting of 1-amino-2-propanol, 2-(2-aminoethoxy)ethanol, 2-aminoethanol, 2-(2-aminoethylamino)-ethanol and 2-(2-aminoethylamino)ethylamine.

14. An alkaline-containing photoresist stripping composition according to claim 12 wherein the amine is selected from the group consisting of 1-amino-2-propanol, 2-(2-aminoethoxy)ethanol, 2-aminoethanol, 2-(2-aminoethylamino)-ethanol and 2-(2-aminoethylamino)ethylamine.

15. An alkaline-containing photoresist stripping composition of claim 8 wherein the stripping solvent comprises one or more solvents selected from the group consisting of 2-pyrrolidinone, 1-methyl-2-pyrrolidinone, 1-ethyl-2-pyrrolidinone, 1-propyl-2-pyrrolidinone, 1-hydroxyethyl-2-pyrrolidinone, 1-hydroxypyl-1-hydroxypropyl-2-pyrrolidinone, diethylene glycol monoalkyl ethers of the formula $HOCH_2CH_2-O-CH_2CH_2-O-R$ where R is an alkyl radical of from 1 to 4 carbon atoms, dialkyl sulfones of the formula

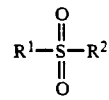

where $R^1$ and $R^2$ are alkyl of 1 to 4 carbon atoms, dimethyl sulfoxide, tetrahydrothiophene-1,1-dioxide compounds of the formula

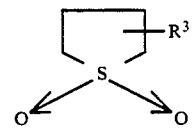

wherein $R_3$ is hydrogen, methyl or ethyl, a polyethylene glycol, dimethylacetamide and dimethylformamide.

16. An alkaline-containing photoresist stripping composition of claim 14 wherein the stripping solvent comprises one or more solvents selected from the group consisting of 2-pyrrolidinone, 1-methyl-2-pyrrolidinone, 1-ethyl-2-pyrrolidinone, 1-propyl-2-pyrrolidinone, 1-hydroxyethyl-2-pyrrolidinone, 1-hydroxypropyl-2-pyrrolidinone, diethylene glycol monoalkyl ethers of the formula $HOCH_2CH_2-O-CH_2CH_2-O-R$ where R is an alkyl radical of from 1 to 4 carbon atoms, dialkyl sulfones of the formula

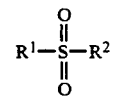

where $R^1$ and $R^2$ are alkyl of 1 to 4 carbon atoms, dimethyl sulfoxide, tetrahydrothiophene-1,1-dioxide compounds of the formula

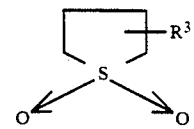

wherein $R^3$ is hydrogen, methyl or ethyl, a polyethylene glycol, dimethylacetamide and dimethylformamide.

17. An alkaline-containing photoresist stripping composition comprising on a weight basis from about 50% to about 98% by weight of N-methylpyrrolidinone, from about 1 to about 50% of an amine selected from 1-amino-2-propanol, 2-(2-aminoethoxy)ethanol and 2-aminoethanol and from about 0.05% to about 25% of acetic acid present in an amount whereby the amine is neutralized such that the stripping composition has an aqueous pH within the range of from about pH 9.6 to about 10.9.

18. In a method of stripping highly cross-linked or hardened photoresist resin from a substrate with a photoresist stripping composition the improvement comprising using the alkaline-containing photoresist stripping composition of claim 1 as the photoresist stripping composition.

19. In a method of stripping highly cross-linked or hardened photoresist resin from a substrate with a photoresist stripping composition the improvement comprising using the alkaline-containing photoresist stripping composition of claim 6 as the photoresist stripping composition.

20. In a method of stripping highly cross-linked or hardened photoresist resin from a substrate with a photoresist stripping composition the improvement comprising using the alkaline-containing photoresist stripping composition of claim 17 as the photoresist stripping composition.

* * * * *